United States Patent [19]

Poulsen

[11] 4,115,184
[45] Sep. 19, 1978

[54] METHOD OF PLASMA ETCHING

[75] Inventor: Robert Gordon Poulsen, Ottawa, Canada

[73] Assignee: Northern Telecom Limited, Montreal, Canada

[21] Appl. No.: 644,911

[22] Filed: Dec. 29, 1975

[51] Int. Cl.² .......................................... H01L 21/306
[52] U.S. Cl. .................................. 156/626; 156/643; 156/646; 315/111.2
[58] Field of Search ...................... 156/2, 17, 345, 643, 156/646, 626, 627; 219/121 P, 494, 498, 510; 204/192 E, 192 SC, 298, 164, 293; 73/68.4; 315/111.2, 111.4

[56] References Cited
U.S. PATENT DOCUMENTS

| | | | |
|---|---|---|---|
| 3,251,228 | 5/1968 | Hanebuth | 73/368.4 |
| 3,315,063 | 4/1967 | Ihlenfelot | 219/498 |
| 3,569,777 | 7/1969 | Beaudry | 315/111.2 |
| 3,574,014 | 4/1971 | Hugle | 156/643 |
| 3,621,378 | 11/1971 | K leiman et al. | 219/498 |
| 3,705,055 | 12/1972 | Christensen et al. | 156/2 |
| 3,867,216 | 2/1975 | Jacob | 156/17 |
| 3,879,597 | 4/1975 | Bersin et al. | 204/164 |

OTHER PUBLICATIONS

Poulsen et al., "Importance of Temperature and Temperature Control in Plasma Etching" Symposium on Etching for Pattern Definition, 1976, pp. 111-121.

Primary Examiner—William A. Powell
Assistant Examiner—Jerome W. Massie
Attorney, Agent, or Firm—Sidney T. Jelly

[57] ABSTRACT

For plasma etching, to obtain high quality, accurate and reproducible results, the temperature of the plasma gas is measured, conveniently as close as possible to the articles to be etched, variations in the temperature from a desired datum being used to control the RF power supply and thus the RF power fed to the reaction chamber. Extremely quick and accurate control of temperature is provided and this provides accurate and reproducible control of etch rate. The rapid temperature response also enables a quick and accurate preheat cycle to be provided prior to the etching cycle. A particularly useful temperature measuring device is a gas thermometer, with a quartz capillary.

5 Claims, 2 Drawing Figures

METHOD OF PLASMA ETCHING

The invention herein described was made in the course of or under a contract or subcontract thereunder with the Department of the Army.

This invention relates to plasma etching and is particularly concerned with providing high quality control of etching.

Plasma etching, particularly in the process of manufacturing semiconductor devices and integrated circuits is attractive because the technique is dry and exceptionally clean; eliminates processing and handling steps necessary in chemical etching; uses only small quantities of safe and inexpensive gases, thus avoiding the necessity for large quantities of expensive, noxious and difficult to dispose of solvents and acids. Moreover plasma etching offers a higher potential of resolution capability and reliability for high density processing than conventional wet chemical processes.

Hitherto plasma etching has not provided adequate control of etch rate or reproducibility of results for many desirable applications.

The present invention provides controllable and reproducable etch rates by accurately controlling the temperature of the plasma, as close to the etch position as possible. In particular, the present invention measures the temperature of the plasma and controllably varies the radio frequency (RF) power to the plasma apparatus to maintain the temperature accurately at a predetermined value. There is a very fast thermal response and the invention can be used to provide a rapid preheat cycle and then maintain the temperature substantially constant after changing over from the preheat cycle to the etch cycle. Various alternatives exist for measuring the temperature, and a particularly convenient one is by the use of a gas thermometer apparatus.

Thus, in accordance with the present invention, a method of plasma etching in a reaction chamber, comprises measuring the temperature of the plasma gas in the reaction chamber; detecting variation of the temperature from a predetermined datum; producing a signal indicative of such temperature variation; and applying the signal to the RF power supply for the reaction chamber to vary the RF power to maintain the temperature substantially constant.

Also in accordance with the present invention, apparatus for controlling the etch rate in a plasma etching reaction chamber, comprises; RF power supply means for supplying RF power to the reaction chamber; means for measuring the temperature of the plasma gas in the reaction chamber; means for detecting a variation in the temperature and for producing a signal indicative of such variation; and means for applying the signal to the RF power supply to vary the RF power to the reaction chamber to maintain the temperature substantially constant.

The invention will be readily understood by the following description of certain embodiments by way of example, in conjunction with the accompanying drawings, in which.

Figure 1:
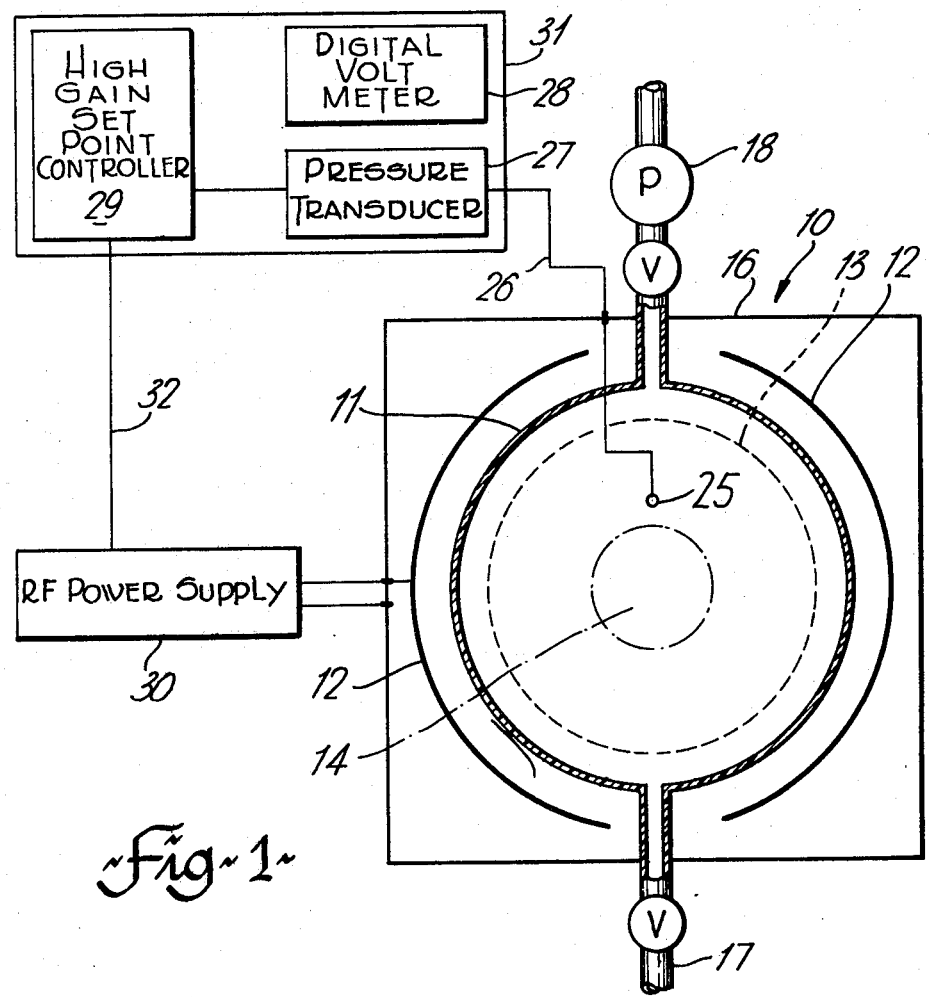
FIG. 1 is a diagrammatic illustration of one form of apparatus.

Considering FIG. 1, there is illustrated diagrammatically in cross-section a plasma etch apparatus, indicated generally at 10. The apparatus comprises a quartz reaction chamber 11, usually cylindrical with an entry door at one end, around which is a RF capacitive, or inductive, coupling plate or coil 12. Inside the chamber 11 is an aluminum plasma shield 13. The parts to be etched are positioned in the centre of the reaction chamber, at 14. The whole is surrounded by RF shielding at 16. As so far described, this is a conventional form of plasma etch apparatus.

In operation an etch gas is slowly fed into the reaction chamber 11 via an inlet 17. The pressure in the reaction chamber is maintained at about 1 Torr by a vacuum pump 18. When RF power is applied to the coupling plate or coil 12, a plasma is formed between the wall of the reaction chamber 11 and the plasma shield 13. Long lived activated components of the plasma are swept through the centre of the chamber and react with unmasked portions of the items, for example wafers, to be etched, forming volatile reaction products which are removed from the chamber by the vacuum pump 18 and exhausted.

The reaction rate, i.e., etching rate, depends upon the etch gas composition and flowrate, pressure in the chamber, the applied RF power, and particularly sensitively upon temperature. Normally, the reaction temperature, and hence the etch rate, depends primarily on the thermal response of the reactor to heating by the RF plasma, the heating effect increasing with increasing RF power. At fixed temperatures the etchant dependance on RF power is slight. Temperature uniformity is improved, in a known manner, by the perforated aluminum plasma shield which, by keeping the nonuniform plasma away from the wafers and by smoothing out temperature nonuniformities via its high thermal conductivity, yields a lower and more uniform temperature distribution. The thermal time constant of such a reactor is typically about 10 minutes.

Normally, the temperature increases, and hence the etch rate increases, with time during etching. The etched thickness becomes sensitive to the temperature of the reaction chamber at the start of the etching process and to nonuniformities in temperature across the batch of wafers, or other articles, being etched. The resulting nonuniformity and nonreproducibility limits the precision of the etching process and the applications for which such a process can be used.

The invention provides accurate and reproducible etch rates by accurately controlling the temperature in the reaction chamber, within the plasma shield, by controllably varying the RF power in accordance with variations in the temperature from a predetermined value. The temperature within the plasma shield can be measured in various ways, for example by a pyrometer, thermocouple or thermistor. However various difficulties exist with such systems. With a pyrometer infrared emission from the plasma interferes with correct readings. Sighting through the quartz wall of the chamber and the narrowness of the emission range of silicon — a popular wafer material — results in a very restricted operating "window" and limited accuracy. Also pyrometers would need recalibrating for each different wafer material.

Thermocouples and thermistors require careful RF shielding and detection with high common mode rejection if accurate temperature measurements are to be achieved. The requirement for RF shielding compromises the speed of response of such sensors to temperature change.

A particularly useful way of measuring the temperature is by a sealed gas-bulb pressure transducer as illustrated in FIG. 1. A quartz gas bulb 25 is positioned close to the articles being etched, and is connected by a quartz capillary tube 26 to a pressure transducer 27. The output of the pressure transducer is fed both the digital volt meter 28 for monitoring purposes and to a high gain set point controller 29.

The gas thermometer is conveniently filled with nitrogen to a typical pressure of 350 Torr at room temperature. As the reaction chamber temperature increases the pressure of the gas in the thermometer increases monotonically and a measure or indication of the temperature is obtained at the analog output of the pressure transducer 27. The analog measure of the temperature $V_g$ is fed into the high gain set point controller 29 which consists in its simplest form of a variable set point voltage supply with output $V_s$, a summing circuit that forms the difference $(V_s-V_g)$, a highgain operational amplifier that forms the signal $V_o = K(V_s-V_g)$, and limiting circuitry that limits $V_o$, which drives the RF power supply 30, from 0 to $V_{max}$. $V_{max}$ is the voltage yielding maximum safe output power levels from the RF power supply. The gain K is set sufficiently high that the difference $(V_s-V_g)$ required to yield $V_{max}$ is smaller than the desired temperature control tolerances. The time constant of the operational amplifier must be sufficiently large (~0.2 seconds) to damp oscillations in $V_o$, the magnitude of this time constant depending on the thermal response of the reactor and the gas thermometer. The sensitivity of the gas thermometer is greatest, and its sensitivity to changes in ambient temperature is smallest, when the volume of the gas thermometer outside the reactor is small; hence the use of capillary tubing between the gas bulb and the pressure transducer. With such small external volume, the sensitivity of $V_g$ to ambient temperature fluctuations is slight. For very tight control of etchrate, transducer and capillary may be positioned within a temperature controlled enclosure. The pressure transducer and the controller are sensitive to RF radiation from the plasma reactor, so RF shielding 31 and elimination of ground loops is essential. Careful shielding of the signal cable 32 from the controller 29 to the RF power supply 30 is also necessary.

Temperature control to ± 1° C., at the articles being etched is readily achieved provided the gas thermometer is refilled occasionally to correct for slow pressure drifts due to outgassing etc., in the sealed gas system. The precision of the gas thermometer, combined with the rapid response and temperature uniformity afforded by plasma preheating, yield accurate etch rate control. The rapid response reduces warm up time, and hence increases manufacturing throughout, and is especially important in maintaining precise temperature control through the transition from preheat to etch gases, when any differing thermal characteristics of the two plasmas may require a change in the RF power level.

Accurate control of the temperature by RF power control has the additional advantage that run to run fluctuations in etch rates and etched thicknesses that otherwise occur, are largely eliminated. Also, etching under equilibrium temperature conditions yields better etchrate uniformity in the useful volume of the reaction chamber than is otherwise obtained. The gas thermometer, as described, has the significant advantage that the temperature sensor can easily be electrically isolated from the RF field, without compromising accuracy, using the quartz capillary tube to eliminate the difficult to circumvent RF noise induced inaccuracies associated even with shielded thermo-coupler and thermistor sensors. The geometry of the gas bulb can be adjusted to average the temperature measurement over the active volume of the plasma reaction chamber.

Figure 2:
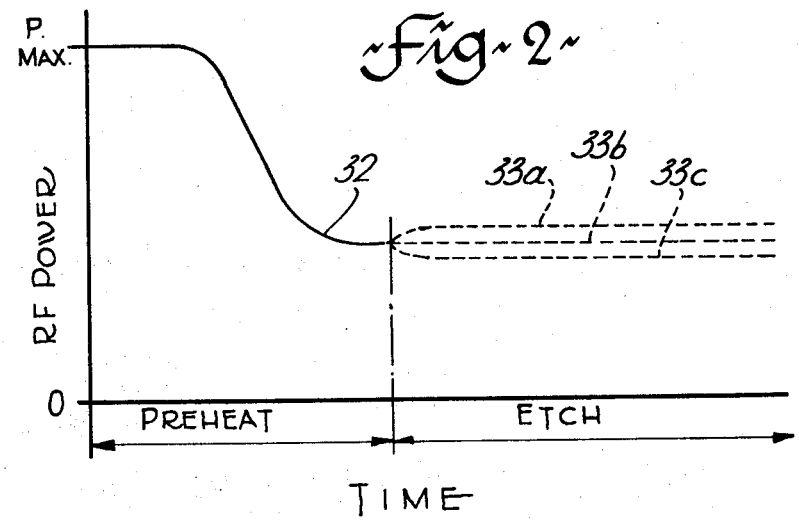
FIG. 2 is a curve illustrative of RF power versus time.

FIG. 2 illustrates the RF power requirements, versus time, in a typical cycle including preheating and etching. The power requirement is maximum at switch on and after a few minutes begins to fall as the temperature rises. Eventually an equilibrium condition is obtained, at 32, the equilibrium power requirement depending upon the set point temperature — increasing with increase in set point and decreasing with decrease in set point. This is the preheat section of the cycle. There is a change in gas but circumstantially, no changes in power requirement. After the preheat section, the etch section of the cycle is initiated. There is likely to be some change in power requirement, depending upon the particular etch gas, or gas mixture, used, as indicated by the dotted lines 33a, 33b and 33 c.

A typical process cycle is as follows:

(a) select etch gas composition for specific application — for example $CF_4 + 5\% O_2$ is suitable for silicon, silicon compounds and titanium. $N_2$ is added to the etchant gas to control the etch rate. Thus for fast etching of $SiO_2$ the amount of $N_2$ is zero, while for slow etch of Polysilicon and of $Si_3N_4$ the nitrogen may be as high as 85% of the $(CF_4 + O_2)$ total gas;

(b) select operating temperature (set point), typically 100°–150° C.;

(c) pre-set flow rates and/or pressures for all gases:
preheat — Nitrogen at 2.0 Torr, typically
etch — etch gas at 0.5–1.0 Torr typically The cycle proceeds as follows: load wafers and pump down; switch on $N_2$ preheat and controller — RF on; temperature equilibrium in 10 to 15 minutes (depends upon RF power available); switch to etch gas until completion of etching (etch time will vary considerably on particular material being etched, as little as 1 minute or more than 50 minutes) — RF off; backfill with nitrogen purge gas; unload.

For photoresist masked wafers, the presence of slowly etching very thin layers of photoresist scum in the unmasked regions to be etched may cause wide fluctuations in the apparent etchrate of the material to be etched. This complication is conveniently eliminated by the introduction, normally at the onset of the preheat cycle, of a short de-scum cycle in which the gas fed into the reaction chamber is oxygen at, for example, 0.7 Torr. The photoresist is thinned during this cycle, and the cycle duration is made long enough to remove the scum but not so long as to appreciably thin the photoresist mask. Removal of such scum can yield significant improvements in the uniformity and reproducibility of the etching process.

The various apparatus items are of conventional form, commercially available. Thus the pressure transducer, for example, can be one sold under the trade name Viatron #218-28, 0–15 psia. The digital voltmeter is a conventional one, having 0.1% resolution. A typical high gain set point controller is a Leeds & Northrup Electronic Controller, with voltage span matching input and output interface circuits. The RF power supply is a standard normal power supply used for plasma etch reactors. Other types of readily available items can be used.

The invention, as stated, provides for very good reproducibility from run to run. Hitherto this has not been obtained. In conventional processes there is no control over temperatures. To start a sequence of cycles, a blank run is often first made, to get the reactor up to temperature etc. It is then assumed that after the blank run, each subsequent run will be essentially the same as the others. However they are not and non-reproducible etching results. The problem is critical when the accurate etching away of a preset thickness is required and less serious when etching down to a layer of material which has a much slower etch rate. In the latter case, a lack of sufficient etch rate control and reproducibility introduces undesirable fluctuations in the dimensional tolerances of etched patterns. This is especially so when the etch rate increases towards the end of the etch cycle in the non-controlled case as the temperature increases. The problems of overetching and undercutting the mask, giving poor etched line width control, are increased in the uncontrolled case.

What is claimed is:

1. A method of plasma etching in a reaction chamber, comprising:

positioning at least one article in the reaction chamber;

reducing the pressure in the chamber to a predetermined pressure;

switching on the RF power to the reaction chamber;

feeding a preheat gas into the chamber to start the plasma;

measuring the gas temperature in the vicinity of the article and applying a signal, indicative of the variation of said temperature from a predetermined datum, to the RF power supply;

varying the RF power to the chamber in accordance with said signal to bring said temperature to, and maintain said temperature at, said datum;

feeding an etchant gas into said reaction chamber at a predetermined flow rate and pressure for a predetermined time to etch said at least one article while varying the RF power to the chamber in accordance with signals indicative of any variation of said temperature from said datum, to return said temperature to and maintain said temperature at said datum;

switching off the RF power to the reaction chamber after said predetermined time; and unloading said article.

2. A method as claimed in claim 1 including measuring the temperature of the plasma gas by a gas thermometer.

3. A method as claimed in claim 1, said reaction chamber including a plasma shield, including measuring said gas temperature inside the plasma shield.

4. A method as claimed in claim 1, including shutting off the preheat gas prior to feeding said etchant gas.

5. A method as claimed in claim 1, including shutting off the preheat gas; introducing oxygen into said reaction chamber after shutting off said preheat gas, said oxygen introduced at a predetermined flow rate for a predetermined time; shutting off said oxygen and introducing said etchant gas.

* * * * *